United States Patent [19]

Shinohara et al.

[11] Patent Number: 4,521,704
[45] Date of Patent: Jun. 4, 1985

[54] DIFFERENTIAL AMPLIFYING CIRCUIT

[75] Inventors: Hirofumi Shinohara; Osamu Tomisawa; Kenji Anami; Masahiko Yoshimoto, all of Itami, Japan

[73] Assignee: Mitsubishi Denki Kabushiki Kaisha, Tokyo, Japan

[21] Appl. No.: 462,204

[22] Filed: Jan. 31, 1983

[30] Foreign Application Priority Data

Feb. 13, 1982 [JP] Japan .................................. 57-23127

[51] Int. Cl.³ .......................... H03F 3/45; H03K 5/02
[52] U.S. Cl. .................................... 307/530; 330/253; 330/260; 330/84
[58] Field of Search .......................... 330/84, 253, 260; 307/279, 530; 365/190, 205, 207, 208

[56] References Cited

FOREIGN PATENT DOCUMENTS 53-98762  8/1978  Japan .
57-52668  11/1982 Japan .

OTHER PUBLICATIONS

IEEE Int'l. Solid-State Circuits Conf., 1976-Session XII: Memory 1.
Journal of Solid-State Circuits, vol. SC-13, No. 5, Oct. 1978, DSA 4K Static Ram.
Chin et al., "Low-Power Data Register", *IBM Technical Disclosure Bulletin*, vol. 15, No. 12, May 1973, pp. 3891–3892.

*Primary Examiner*—James B. Mullins
*Attorney, Agent, or Firm*—Lowe, King, Price & Becker

[57] ABSTRACT

A differential amplifying circuit includes a pair of main amplifying circuits (5a, 5b) each having at least three input terminals and at least one output terminal, and a pair of auxiliary amplifying circuits (6a, 6b) each having at least one input terminal. Complimentary inputs (D1, $\overline{D1}$) are connected to the input terminals of said pair of auxiliary amplifying circuits (6a, 6b), the outputs (D2, $\overline{D2}$) of the main amplifying circuits (5a, 5b) are connected as crossing feedback inputs to at least a pair of input terminals of said pair of main amplifying circuits (5a, 5b), the complimentary inputs (D2, $\overline{D2}$) are also connected to the other at least one pair of input terminals, and the outputs of said auxiliary amplifying circuits (6a, 6b) are further connected to the further at least pair of input terminals.

6 Claims, 5 Drawing Figures

DIFFERENTIAL AMPLIFYING CIRCUIT

BACKGROUND OF THE INVENTION

1. Field of the Invention

The present invention relates to a differential amplifying circuit. More specifically, the present invention relates to a differential amplifying circuit utilizing MOS transistors having a large amplification factor and a quick transient response rate.

2. Description of the Prior Art

FIG. 1 shows a conventional circuit of this type. Referring to the figure, the reference characters D1 and $\overline{D1}$ are complementary inputs, the reference characters D2 and $\overline{D2}$ are complementary outputs, the reference numeral 1 denotes a voltage source of normally about 5 V, the reference characters 2a and 2b denote depletion type load MOS transistors, the reference characters 3a and 3b denote enhancement type cross-connected MOS transistors, and the reference characters 4a and 4b denote enhancement type driver MOS transistors. The transistors 2a, 3a and 4a and the transistors 2b, 3b and 4b are each connected in series between the voltage source and the ground, whereby a pair of main amplifying circuits 5a and 5b of three inputs are formed.

The outputs $\overline{D2}$ and D2 of the pair of the main amplifying circuits 5a and 5b are connected in a crossing feedback fashion to the gates of the transistors 3b and 3a.

The other four inputs of the main amplifying circuits are connected such that the input $\overline{D1}$ is connected to the gates of the transistors 2a and 4b and the input D1 is connected to the gates of the transistors 2b and 4a. The pair of the main amplifying circuits constitute as a whole a differential main amplifying circuit with the inputs D1 and $\overline{D1}$ as the inputs thereof and with the outputs D2 and $\overline{D2}$ as the outputs thereof.

Now an operation thereof will be described. First let it be assumed that the high level voltage is applied to the input D1 and the low level voltage is applied to the input $\overline{D1}$. In the main amplifying circuit 5a, the gate voltage $\overline{D1}$ of the load transistor 2a is the low level and a current supply capability is small, while the gate voltage D1 of the driver transistor 4a is the high level and a current drive capability is large, whereby the output $\overline{D2}$ becomes the low level voltage. Conversely, in the main amplifying circuit 5b, the gate voltage D1 of the load transistor 2b is the high level and a current supply capability is large, while the gate voltage $\overline{D1}$ of the driver transistor 4b is the low level and a current drive capability is small, whereby the output D2 becomes the high level. Furthermore, since the outputs D2 and $\overline{D2}$ are supplied to the gates of the transistors 3a and 3b so that the same are fed back, the amplification factor is increased and a constant amplification factor and a constant output level are attained for a broad range of the input level.

FIG. 2 shows another conventional circuit of this type, which is different from the FIG. 1 circuit. Referring to FIG. 2, the outputs $\overline{D2}$ and D2 are inputted in a feedback fashion to the gates of the load transistors 2a and 2b.

Since the conventional differential amplifying circuits are implemented only with a pair of three-input main amplifying circuits 5a and 5b, as described in the foregoing, it is necessary to connect the inputs $\overline{D1}$ and D1 to the gates of the load transistors 2a and 2b or to supply the outputs $\overline{D2}$ and D2 in a feedback fashion; however, the former case involves a disadvantage that the amplification factor is small and the output of the high level voltage as high as approximately the source voltage cannot be obtained when the input voltage is low, whereas the latter case involves a disadvantage that a transient response rate in the case where the input signal changes is slow.

SUMMARY OF THE INVENTION

The present invention was made to eliminate the above described disadvantages of the conventional circuits and aims to provide a differential amplifying circuit having a large amplification factor and a quick transient response rate by adding a pair of auxiliary amplifying circuits.

Briefly described, the present invention comprises a differential amplifying circuit including a pair of main amplifying circuits each having at least three input terminals and at least one output terminal, and a pair of auxiliary amplifying circuits each having at least one input terminal, characterized in that complementary inputs are connected to the input terminals of said pair of auxiliary amplifying circuits, the outputs of the main amplifying circuits are connected as crossing feedback inputs to at least a pair of input terminals of said pair of main amplifying circuits, the complementary inputs are also connected to the other at least one pair of input terminals, and the outputs of said auxiliary amplifying circuits are further connected to the further at least pair of input terminals.

As described in the foregoing, since the present invention is adapted such that a pair of auxiliary amplifying circuits are added to a pair of main amplifying circuits connected in a crossing manner, an advantage is brought about that a differential amplifying circuit having an increased amplification factor and a quick transient response rate is provided. These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
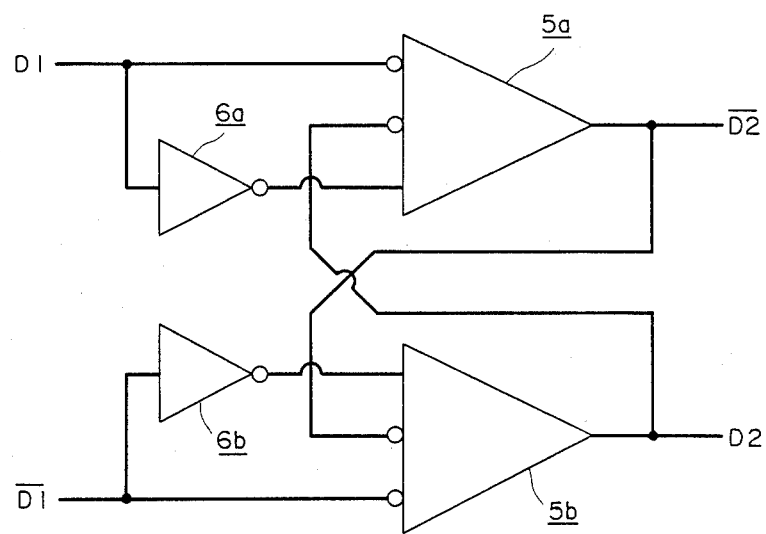
FIG. 3 is a logical diagram showing one embodiment of the present invention.
Figure 4:
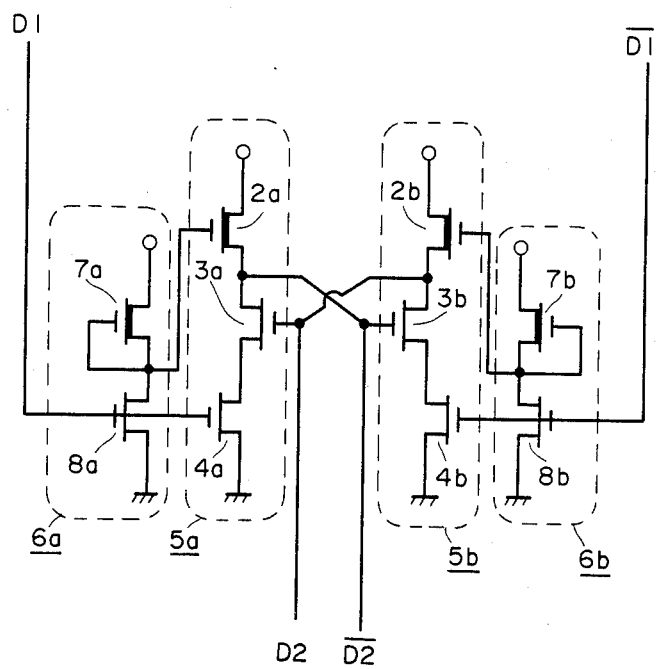
FIG. 4 is a schematic diagram of a differential amplifying circuit in accordance with one embodiment of the present invention.

In the following one embodiment of the present invention will be described with reference to the figures. FIG. 3 is a logic diagram showing the concept of the present invention and FIG. 4 is a schematic diagram of an implementation using MOS transistors. Referring to the figures, the reference characters 6a and 6b denote a pair of auxiliary amplifying circuits, in which the inputs $\overline{D1}$ and D1 of the differential amplifying circuit are used as inputs and the outputs are supplied to the gates of the load transistors each of which is one of the inputs of the main amplifying circuits. The reference characters 6a and 6b denote ED inverters implemented by depletion type load MOS transistors 7a and 7b and enhancement type driver transistors 8a and 8b, respectively.

Figure 1:
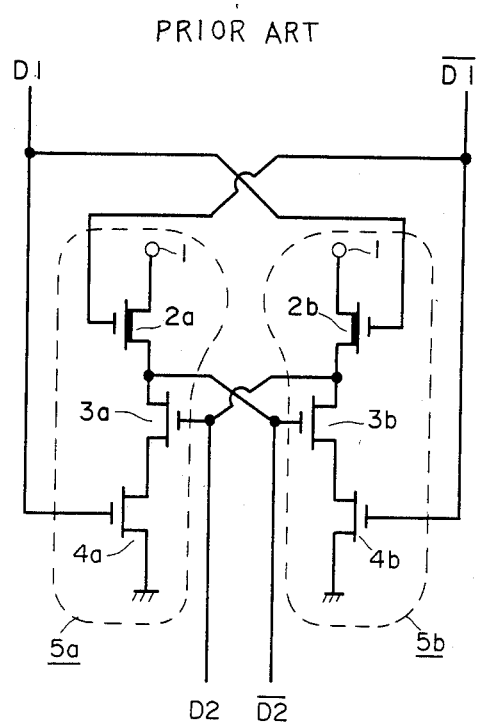
FIGS. 1 and 2 are diagrams of conventional differential amplifying circuits.
Figure 2:
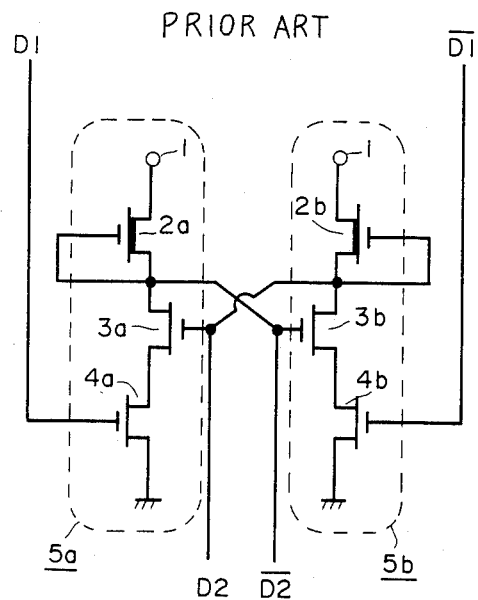

Now an operation thereof will be described. Let it be assumed that the high level voltage is supplied to the input D1 and the low level voltage is supplied to the input $\overline{D1}$. The low level voltage and the high level voltage are supplied to the gates of the load transistors 2a and 2b, respectively, such that the logics are the same as those in the FIG. 1 conventional circuit; however, the difference of the gate voltages of 3a and 3b, i.e. the amplitude is amplified by the auxiliary amplifying circuits 6a and 6b and therefore are larger than the case where inputs $\overline{D1}$ and D1 are directly supplied. Accordingly, the amplitudes of the outputs D2 and $\overline{D2}$ are magnified and an increased amplification factor is obtained. Furthermore, in comparison with the FIG. 2 conventional circuit, the gates of the load transistors 2a and 2b are not of feedback inputs and in addition the output load capacitances of the auxiliary amplifying circuits 6a and 6b are small as compared with the capacitances incidental to the outputs D2 and $\overline{D2}$ and therefore the response rate of the gate voltages of the transistors 3a and 3b in the case where the inputs D1 and $\overline{D1}$ change is quick, with the result that the response rate of the output D2 and $\overline{D2}$ is also quick. The above described difference is conspicuous particularly in the case where the capacitance incidental to the outputs D2 and $\overline{D2}$ are large, whereby the inventive circuit is suited for a differential amplifying circuit of a large output load capacitance.

Figure 5:
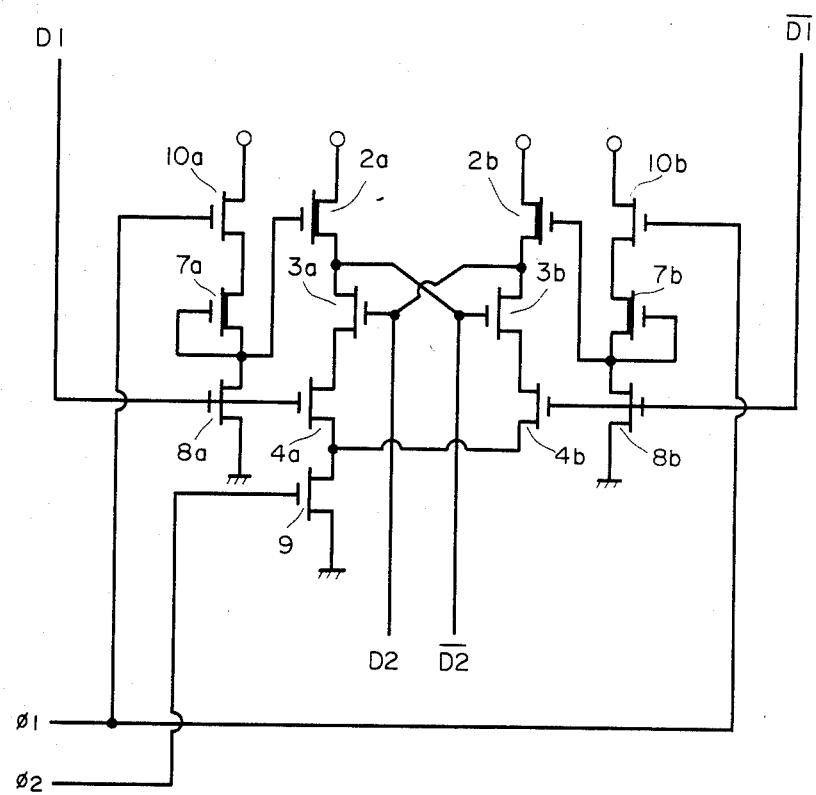
FIG. 5 is a schematic diagram of a differential amplifying circuit showing another embodiment of the present invention.

Meanwhile, although in the above described embodiment the load transistors 2a and 2b, and 7a and 7b of the main amplifying circuits and the auxiliary amplifying circuits were each shown as of a depletion type MOS transistor, the same may be of an enhancement type MOS transistor; and although a one stage inverter was shown as the auxiliary amplifying circuit, a two or more-stage inverter may be employed; and although an example of having either the output D1 or $\overline{D1}$ inputted to the auxiliary amplifying circuits was shown, both of the outputs D1 and $\overline{D1}$ may be inputted. Furthermore, control MOS transistors 9 and 10a and 10b may be inserted in series and controlled by the clocks ∅1 and ∅2, as shown in FIG. 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A differntial amplifying circuit including a pair of main amplifying circuits each having at least three input terminals and at least one output terminal, and a pair of auxiliary amplifying circuits each having at least one amplifying input terminal and at least one output terminal, characterzed in that complementary inputs are connected respectively to the amplifying input terminals of said pair of auxiliary amplifying circuits, the outputs of the main amplifying circuits are connected respectively as crossing feedback inputs to at least another pair of amplifying input terminals of said pair of main amplifying circuits, the complementary inputs are also connected respectively to another at least one pair of amplifying input terminals of said pair of main amplifying circuits, and the output terminals of said auxiliary amplifying circuits are connected to a further at least one pair of amplifying input terminals of said main amplifying circuits.

2. A differential amplifying circuit recited in claim 1, wherein said main amplifying circuits are each comprised of a series connection of at least three MOS transistors, a gate terminal of each transistor forming one of said input terminals and at least one source/drain junction portion forming said output terminal.

3. A differential amplifying circuit as recited in claim 2, wherein said auxiliary amplifying circuits are each comprised of a series connection of at least two MOS transistors, the gate of a respective one of said transistors comprising a respective amplifying input terminal of each of said auxiliary amplifying circuits.

4. A differential amplifying circuit as recited in claim 3, wherein one of said series connected transistors of each of said main amplifying circuits compries a load transistor, the gate terminal of said load transistor connected for receiving an output from said output terminal of said auxiliary amplifying circuit.

5. A differential amplifying circuit as recited in claim 3 wherein each of said auxiliary amplifying circuits further comprises a series connected control transistor having an input terminal, and wherein a pair of clock signal terminals are respectively connected to said input terminals of said control transistors.

6. A differential amplifying circuit recited in claim 1, wherein said auxiliary amplifying circuits each comprise at least one stage of an inverter circuit.

* * * * *